United States Patent [19]

Kakoschke

[11] Patent Number: 5,399,523
[45] Date of Patent: Mar. 21, 1995

[54] METHOD FOR THE RAPID THERMAL PROCESSING OF A SEMICONDUCTOR WAFER BY IRRADIATION

[75] Inventor: Ronald Kakoschke, Munich, Germany

[73] Assignee: Siemens Aktiengesellscaft, Munich, Germany

[21] Appl. No.: 271,563

[22] Filed: Jul. 7, 1994

Related U.S. Application Data

[63] Continuation of Ser. No. 851,328, Mar. 16, 1992, abandoned.

[30] Foreign Application Priority Data

Mar. 26, 1991 [DE] Germany .................. 41 09 956.7

[51] Int. Cl.⁶ ...................... H01L 21/26; H01L 21/42
[52] U.S. Cl. ...................... 437/173; 437/174
[58] Field of Search .............. 437/173, 174; 392/411, 392/416, 422

[56] References Cited

U.S. PATENT DOCUMENTS

| | | | |
|---|---|---|---|
| 3,052,789 | 9/1959 | Trainor | 392/422 |
| 3,763,348 | 10/1973 | Costello | 219/347 |
| 4,001,047 | 1/1977 | Boah | 392/422 |
| 4,416,068 | 11/1983 | Nilsson et al. | 392/416 |
| 4,468,259 | 8/1984 | Mimura | 148/1.5 |
| 4,469,529 | 9/1984 | Mimura | 148/1.5 |
| 4,493,977 | 1/1985 | Arai et al. | 219/411 |
| 4,571,486 | 2/1986 | Arai et al. | 437/173 |
| 4,729,962 | 3/1988 | Campbell | 437/173 |
| 4,766,288 | 8/1988 | Berkes et al. | 392/416 |
| 4,981,815 | 1/1991 | Kakoschke | 437/173 |

FOREIGN PATENT DOCUMENTS

| | | | |
|---|---|---|---|
| 619224 | 5/1961 | Canada | 392/422 |
| 0345443 | 12/1989 | European Pat. Off. | |
| 2653215 | 4/1991 | France | 392/411 |
| 3139712 | 10/1984 | Germany | |
| 240923 | 11/1985 | Japan | 392/416 |

OTHER PUBLICATIONS

R. Kakoschke, et al "Modelling of Wafer Heating During Rapid Thermal Processing" Appl. Phys. A 50, pp. 141–150 (1990).

*Primary Examiner*—R. Bruce Breneman
*Assistant Examiner*—Linda J. Fleck
*Attorney, Agent, or Firm*—Hill, Steadman & Simpson

[57] ABSTRACT

In a method for rapid thermal processing of a semiconductor wafer by electromagnetic irradiation, an irradiation arrangement is provided for heating the semiconductor wafer which is surrounded by a quartz chamber. The irradiation arrangement has a reflector design and is employed such that the semiconductor wafer is irradiated so that a substantially identical temperature is achieved in a middle and in an edge region on the basis of an intensity distribution of the light and of the heat emission of the semiconductor wafer, each of which is respectively uniform by itself over the semiconductor wafer. The method serves the purpose of improving rapid thermal processing methods in the manufacture of integrated semiconductor circuits.

1 Claim, 3 Drawing Sheets

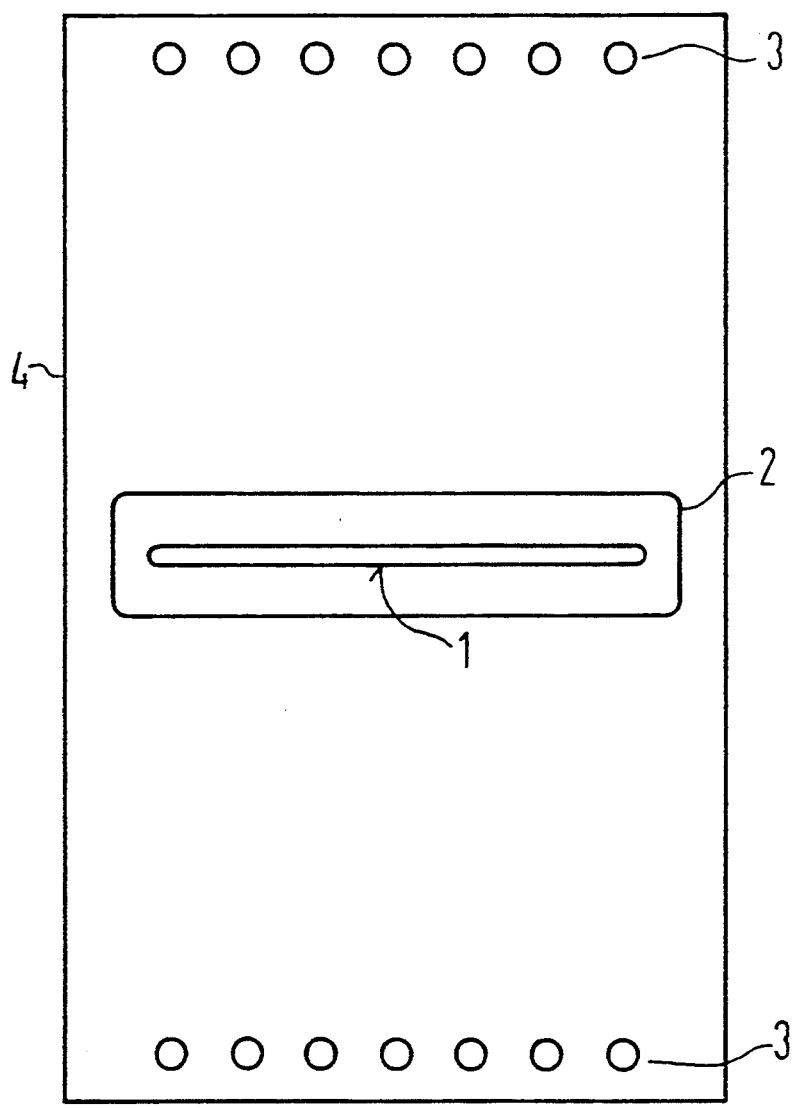

METHOD FOR THE RAPID THERMAL PROCESSING OF A SEMICONDUCTOR WAFER BY IRRADIATION

This is a continuation of application Ser. No. 07/851,328, filed Mar. 16, 1992, now abandoned.

BACKGROUND OF THE INVENTION

The invention is directed to a method for rapid thermal processing of a semiconductor wafer by electromagnetic irradiation, comprising an irradiation arrangement for heating the semiconductor wafer preferably surrounded by a quartz chamber. This irradiation arrangement is composed of a plurality of light sources with the light of which the semiconductor wafer is irradiated at at least one side, as well as comprising a reflection chamber employed as a reflector that entirely encloses the semiconductor wafer and the light sources.

Such a method is disclosed, for example, by European Published Application 0 345 443, incorporated herein.

Rapid thermal processing methods (rapid thermal processing (RTP) or rapid thermal annealing (RTA)) are gaining greater and greater significance in the manufacture of electronic components on semiconductor wafers on a silicon or gallium arsenide basis. The principal advantages thereof—a reduced temperature stress and a rational manufacturing process—are utilized, among other things, in the manufacture of thin dielectrics, in silicidation reactions, and when flowing layers, for example of borphosphorous silicate glass. The semiconductor wafers are thereby individually introduced into a process chamber and are then very rapidly and optimally uniformly heated under a defined atmosphere by irradiation with an intense light source. A typical temperature-time cycle, for example, is a heating rate of 300° C./sec to 1100° C., a following annealing time of 5 sec at 1100° C. and a cooling rate of 100° C./sec.

An important condition for achieving high yields in rapid thermal processing is an adequately uniform temperature distribution over the semiconductor wafer. Particularly given large semiconductor wafer diameters, however, this demand represents a problem that has not yet been satisfactorily resolved. This shall be set forth below with reference to FIG. 1.

FIG. 1 schematically shows a widespread type of RTP system in section. The semiconductor wafer 1 to be heated is usually situated in a quartz chamber 2. The light source is composed of two rows of quartz halogen lamps (lamp banks 3). The reflector in the form of a cuboid reflection chamber 4 that surrounds the lamps and the semiconductor wafer 1 sees to it, on the one hand, that optimally low losses of the lamp light occur and also sees to it, on the other hand, that the losses due to thermal emission from the hot semiconductor wafer 1 are kept low. It is only possible to achieve high temperatures (>1100° C.) and a rapid heating in many RTP systems only when the area covered by the lamp banks is greater than the wafer area and the losses are kept minimal.

In FIG. 1, the light emitted by the lamps, and possibly singly or multiply reflected at the walls of the reflection chamber, is indicated by solid arrows, but with the heat emission being indicated by wavy arrows. It is known from the aforementioned, European Patent Application that the additional area at the semiconductor wafer edge 5 increases the heat emission thereat, this leading to a temperature that is reduced in comparison to the middle 6 of the semiconductor wafer. A uniform intensity distribution of the light, together with the non-uniform intensity distribution of the heat emission, therefore results in a temperature distribution that is non-uniform overall over the semiconductor wafer 1. A known possibility for correcting this is comprised in irradiating the semiconductor wafer edge 5 with increased intensity in comparison to the middle 6 of the semiconductor wafer, whereby the ratio of the intensities is constant during the entire annealing process. Although a uniform temperature distribution occurs as a result in this method, the rated temperature is only achieved after a certain time that is dependent on the thermal mass of the semiconductor wafer 1 and on the amount of the rated temperature, and that amounts to approximately 5 to 10 sec for six inch wafers. Given short annealing times (5 sec), regions at the semiconductor wafer edge 5 can therefore experience a temperature stressing that averages up to 50° C. higher than regions in the middle 6 of the semiconductor wafer.

The different temperature-time curves at the edge and in the middle of the semiconductor wafer ultimately have a negative influence on the yield, particularly given large wafers, in the production of electronic components on a silicon basis. It is therefore proposed in the prior art to compensate the additional heat emission in the edge region of the semiconductor wafer with an additional irradiation directed onto the edge region whose intensity, however, is chronologically variable and which is controlled on the basis of temperature measurement or on the basis of previously calculated curve values such that a temperature distribution that is uniform overall is set during the entire annealing process. Specifically, for example, an additional reflection screen having a hemispherically arced cross section is proposed as a means for additional irradiation, this being arranged around the semiconductor wafer edge such that the heat emission proceeding therefrom is again reflected back onto the semiconductor wafer edge in a self-regulating fashion. It is proposed in a further exemplary embodiment having a cuboid reflection chamber entirely surrounding the lamps that the spacing between reflector and semiconductor wafer can be varied for compensating the temperature differences over the semiconductor wafer. Due to the complex control and/or additional light sources, however, this known method is relatively involved and is also complicated to manipulate.

The temperature distribution over the semiconductor wafer is fundamentally defined by the distribution of the following, two radiant contributions:

1. Intensity distribution of the lamp light, including multiple reflections at the wafer and at the reflector;
2. Intensity distribution of the heat emission of the wafer that may potentially be reflected back thereonto (equivalent to a reduction in the losses relative to the case without back-reflection).

The possibility was already indicated above of compensating non-uniform losses that are generally greater at the wafer edge than in the middle thereof by increasing the intensity of the lamp light at the edge of the wafer relative to the wafer middle. The lamp intensity, however, can only be set such that a compensation occurs only for a specific temperature-time cycle. It must therefore be specifically readapted for every cycle since the transient temperature distribution otherwise gains insignificance given shorter times or faster heating, or conversely, the stationary temperature distribution gains insignificance given longer times over slower heating. Among other things, the problem is that techniques are in fact known that, for example, improve the uniform distribution of the losses but that these techniques, on the other hand, simultaneously deteriorate the distribution of the lamp light.

Foregoing reflection of the heat emission of the wafer by employing what is referred to as a black chamber also does not lead to the goal. The losses become so high that extremely high-intensity lamps having increased space requirements—not least of all for the power supply as well—must be utilized. Since, moreover, irradiation at both sides is needed in order to avoid temperature gradients in the wafer material caused by structures, such apparatus become extremely large. All other solutions that have hitherto been proposed are also not without their disadvantageous aspects.

SUMMARY OF THE INVENTION

It is an object of the invention to specify a method of the type initially cited that guarantees a high uniformity of the temperature distribution between center and periphery of the semiconductor wafer during the entire annealing process in a simple way.

The object of the invention is achieved wherein an irradiation arrangement, particularly a reflector design, is employed wherein the semiconductor wafer is irradiated upon implementation of the method such that a substantially identical temperature is achieved in the middle and in the edge region of the semiconductor wafer on the basis of an intensity distribution of the light and of the heat emission of the semiconductor wafer which are each respectively uniform over the semiconductor wafer.

A more detailed investigation of the causes for non-uniform intensity distributions of the afore-mentioned, two radiant contributions show that thermal radiation that is emitted far enough from the wafer edge and at a small angle relative to the wafer normal already proceeds back onto the wafer after one reflection, whereas thermal radiation emitted close to the wafer edge at a small angle does not proceed back onto the wafer until after several reflections, whereby the wafer edge is again preferably impinged. Similarly, light that is emitted far enough from the projection of the wafer edge (but within the projection) onto the plane of the lamp bank and at a small angle relative to the wafer normal proceeds back onto the wafer directly or at most after one reflection, whereas light that is emitted at a small angle within the projection in the proximity of the wafer edge does not proceed back onto the wafer until after several reflections. The wafer edge is thereby again preferably impinged. Likewise valid within the projection in view of heat emission and irradiation with light is that the intensity distribution thereof would be uniform if the reflectivity of the reflector material were ideal. In practice, however, the value of the reflectivity is not 1; rather, typical values thereof are 0.9 through 0.95. For this reason, the intensity of the back-reflected heat emission at the wafer edge and the intensity of the lamp light at the wafer edge are lower due to multiple reflections.

When, on the other hand, light is emitted outside the wafer projection at small angles relative to the wafer normal, then this leads to an additional irradiation of the wafer edge, i.e. to an increase in the intensity. When more light outside the wafer projection arises than is necessary for compensating the losses due to multiple reflections, then the result thereof is that the intensity of the lamp light is higher at the wafer edge than in the wafer center. The back-reflected heat emission, by contrast, is lower at the wafer edge in every case.

Since it has also been discovered that light which is emitted at a large angle relative to the wafer normal uniformly distributes over the semiconductor wafer in all cases, the object is to design a reflector with which both the intensity distribution of the lamp light as well as the losses due to heat emission are uniform.

The invention shall be set forth in greater detail below with reference to a number of exemplary embodiments and with reference to the drawings.

BRIEF DESCRIPTION OF THE DRAWINGS

FIGS. 3 and 4 are further exemplary embodiments of arrangements for the implementation of the method of the invention.

DESCRIPTION OF THE PREFERRED EMBODIMENTS

Figure 1:
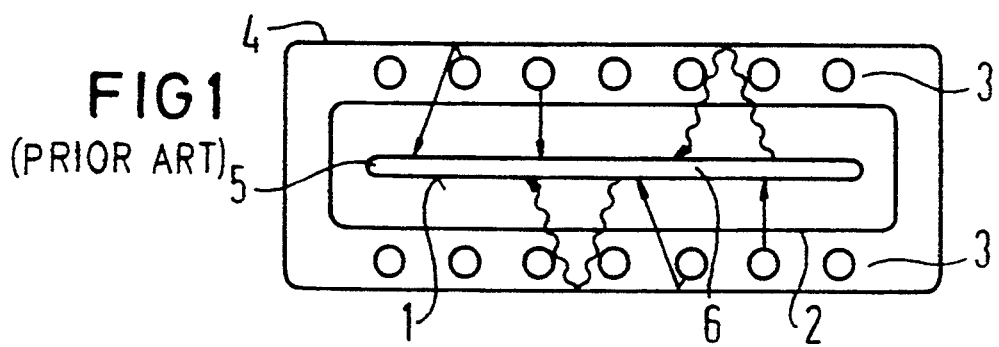
FIG. 1 shows a prior art method for rapid thermal processing of a semiconductor wafer by irradiation.
Figure 2:
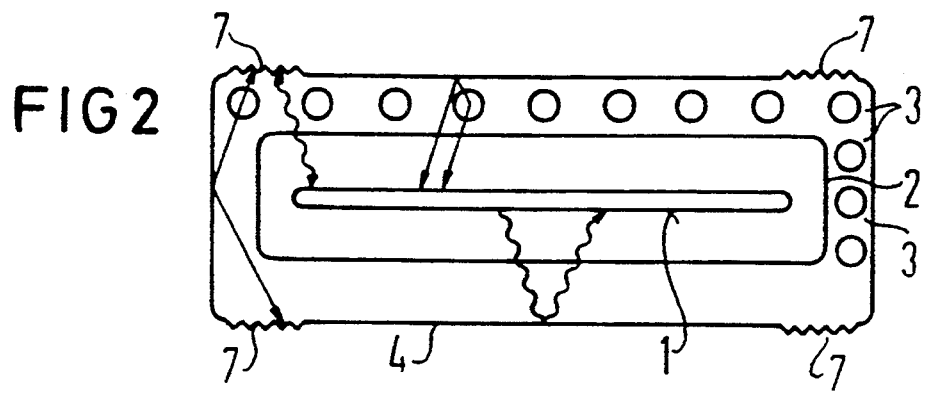
FIG. 2 shows a first exemplary embodiment of an arrangement for the implementation of the method of the invention, shown schematically and in section.

In the following FIGS. 2, 3, and 4, reference characters identical to those in FIG. 1 have the same significance as in FIG. 1. In FIG. 2, primarily single-sided irradiation of the upper side of the semiconductor wafer 1 by a lamp bank 3 arranged parallel to the end face of the semiconductor wafer 1 is shown, in contrast to FIG. 1. Insofar as the space requirements allow it, however, it is advantageous both here and in the following exemplary embodiments to also employ light sources that are differently arranged.

FIG. 2 shows a cuboid reflection chamber 4 in the reflector walls of which reflectors 7, preferably triple mirrors or mirror lenses, are arranged. As shown, the reflex reflectors 7 can be built in at the edge regions of the upper and lower reflector wall; however, they can also cover the entire area of the reflector walls. As a result of the reflex reflectors, multiple reflections of light and heat emission having a small angle vis-a-vis the wafer normal at the wafer edge are prevented, whereby, however, the high reflectivity of the reflector that is otherwise assured by selecting gold or aluminum as a material for the reflector walls is maintained to the farthest-reaching degree. Heat emission and light within the wafer projection (having a small angle and close to the wafer edge) are reflected back onto themselves by the reflex reflector 7 and proceed back onto the semiconductor wafer 1 after only one reflection. On the other hand, lamp light that is emitted outside the wafer projection at a small angle and—as set forth above—would lead to an increase in intensity at the wafer edge, is reflected back and forth between the reflex reflectors 7 of the upper and lower reflector wall and does not proceed onto the semiconductor wafer 1.

Given one of the frequently employed, cuboid reflection chambers 4, the corners partially act as reflex reflectors 7 (triple mirrors). The height of such reflection chambers is usually less than their width, or than their depth. As a consequence of the cuboid form, however, the reflected rays do not return back onto themselves, but are offset parallel. When a cubic reflection chamber whose edge length is approximately 1.3 times greater than the wafer diameter is employed, then the reflex reflector effect is optimally exploited due to this adaptation of the edge length to the wafer diameter, and the intensity distribution of the back-reflected heat emission is extremely uniform. In order to also have the intensity distribution of the lamp light become uniform, the lamps are arranged such that only that quantity of light arises outside the wafer projection that is necessary for compensating the losses due to multiple reflections.

FIG. 3 shows a reflection chamber 4 whose height is greater than twice the wafer diameter. The result of the great height is that the emission angle causing the non-uniform intensity distributions becomes smaller relative to the wafer normal. The portion of the lamp light or of the heat emission of the semiconductor wafer 1 that leads to non-uniform intensity distributions, is thus also reduced. Given this arrangement for the implementation of the method of the invention, it is advantageous that no particular measures need be undertaken in order to improve the distribution of the lamp light.

Figure 4:
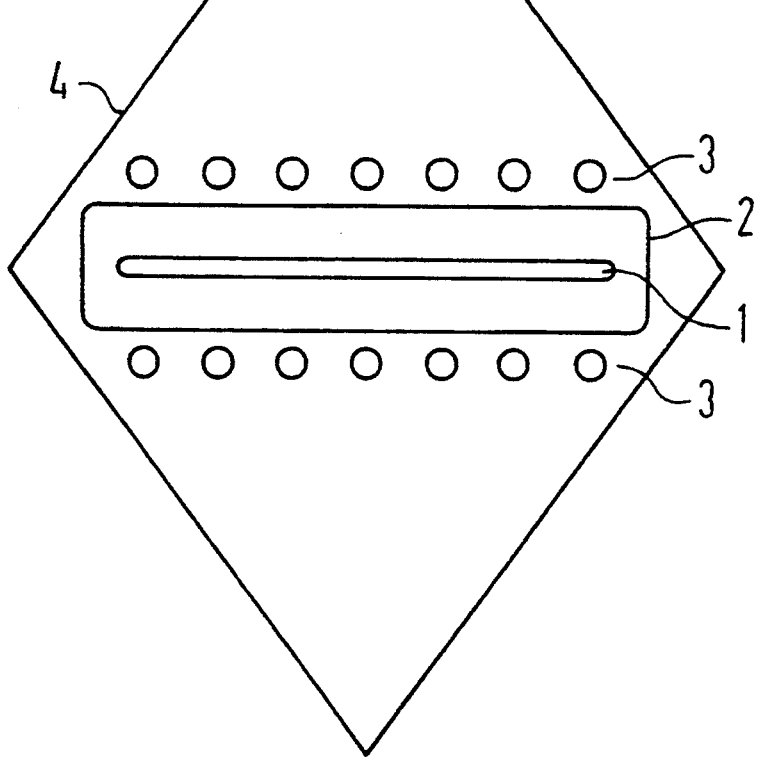

FIG. 4 shows a reflection chamber 4 that has the form of an elongated octahedron. What this special reflector geometry achieves is that light that is emitted from an arbitrary location onto the semiconductor wafer 1 or from the lamps does not proceed to privileged regions of the wafer, but is uniformly distributed over the wafer. Both the lamp light as well as the back-reflected heat emission become uniform at the same time.

It has a beneficial effect in all exemplary embodiments when the area in the wafer plane is extremely small between wafer edge and the reflector walls, so that multiple reflections can hardly occur. A cylindrical reflection chamber whose cylinder radius is matched to the wafer radius satisfies this demand best (for example, cylinder radius $\leq$ wafer radius $+0.5$ cm).

The following values are proposed as typical annealing cycles for the recited exemplary embodiments:

Cycle 1 (see curve I and III in FIG. 5):
  heating at 200° C./sec to 1100° C.
  remaining at 1100° C. for 5 sec
  cooling as a result of natural heat emission
Cycle 2 (see curve II and IV in FIG. 5):
  heating at 20° C./sec to 1100° C.
  remaining at 1100° C. for 30 sec
  cooling as a result of natural heat emission.

Figure 5:
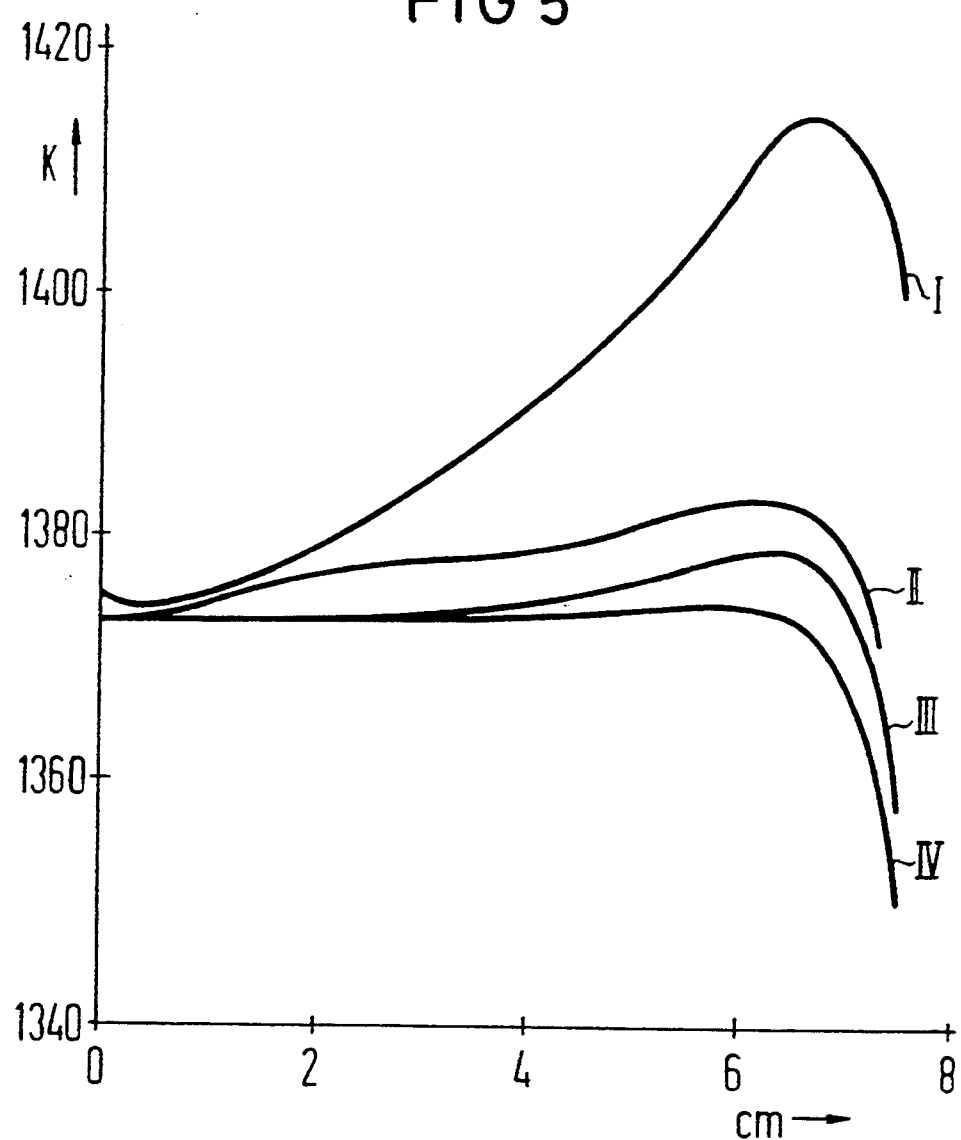
FIG. 5 shows the distribution of temperature over the semiconductor wafer in the prior art and in the method of the invention, each respectively dependent on the distance from the center of the wafer.

FIG. 5 shows a diagram wherein the anticipated, theoretically calculated, averaged temperature distributions are shown. Given a reactor (for example, height equals 10 cm, width equals 20 cm, depth equals 20 cm) corresponding to the traditional method, not only does the known, undesired temperature elevation occur at the edge region of the semiconductor wafer (see curve I and II) but a great difference in the temperature distributions appears after cycle 1 (curve I) and cycle 2 (curve II). This is not the case with the inventively implemented method (curves III and IV). Overall, these curves document the noticeable improvement that arises as a result of the techniques disclosed in the exemplary embodiments.

Although various minor changes and modifications might be proposed by those skilled in the art, it will be understood that I wish to include within the claims of the patent warranted hereon all such changes and modifications as reasonably come within my contribution to the art.

I claim as my invention:

1. A method for rapid thermal processing of a semiconductor wafer by electromagnetic irradiation, comprising the steps of:

providing a quartz heating chamber in the form of a cuboid reflector chamber having a wall structure containing light emitting heating elements and outer surfaces of the reflector chamber forming sidewalls outwardly of an outer peripheral edge of the wafer and upper and lower reflector walls parallel to the wafer, said reflector chamber forming a cuboid having eight corners;

arranging the light sources so as to provide a uniform intensity distribution of the light on the semiconductor wafer; and providing an intensity distribution of heat emission which is improved with respect to uniformity across the semiconductor wafer by providing on the upper and lower reflector walls at least adjacent to triple mirror structures defined by corners of the cuboid a triple mirror reflector structure, the uniformity of the intensity distribution of the light and the uniformity of the heat emission from the semiconductor wafer across the wafer improving a uniformity of temperature distribution between a center of the semiconductor wafer and an outermost periphery of the semiconductor wafer.

* * * * *